United States Patent
Avritch et al.

(10) Patent No.: US 9,007,087 B2
(45) Date of Patent: Apr. 14, 2015

(54) SYSTEM AND METHOD FOR AUTOMATED FAILURE DETECTION OF HOLD-UP POWER STORAGE DEVICES

(71) Applicant: Hamilton Sundstrand Corporation, Windsor Locks, CT (US)

(72) Inventors: Steven A. Avritch, Bristol, CT (US); Kanwalpreet Reen, Bristol, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 300 days.

(21) Appl. No.: 13/649,586

(22) Filed: Oct. 11, 2012

(65) Prior Publication Data

US 2014/0103955 A1   Apr. 17, 2014

(51) Int. Cl.
   *G01R 31/40* (2014.01)
   *G01R 31/02* (2006.01)
   *G01R 27/26* (2006.01)

(52) U.S. Cl.
   CPC .......... *G01R 31/028* (2013.01); *G01R 27/2605* (2013.01)

(58) Field of Classification Search
   CPC ...... G01R 31/025; G01R 31/02; G01R 31/40; G01R 17/00; G01R 31/007; G01R 31/2605; G01R 31/3177; G01R 31/327
   See application file for complete search history.

(56) References Cited

U.S. PATENT DOCUMENTS

| | | | |
|---|---|---|---|
| 5,437,040 A * | 7/1995 | Campbell et al. | 713/340 |
| 6,128,169 A * | 10/2000 | Neiger et al. | 361/42 |
| 6,262,871 B1 * | 7/2001 | Nemir et al. | 361/42 |

* cited by examiner

*Primary Examiner* — Tung X Nguyen
*(74) Attorney, Agent, or Firm* — Kinney & Lange, P.A.

(57) ABSTRACT

A fault detection circuit is utilized to automatically detect faults in hold-up power storage devices. The fault detection circuit includes a hold-up monitoring circuit and a memory device. The hold-up monitoring circuit is connected to monitor output of the hold-up power storage device, wherein the hold-up monitoring circuit measures a duration of time that the hold-up power storage device provides sufficient power following a loss of normal power and detects faults based on the measured duration of time. The memory device is connected to store the duration of time measured by the hold-up power storage device following a loss of normal power.

17 Claims, 3 Drawing Sheets

SYSTEM AND METHOD FOR AUTOMATED FAILURE DETECTION OF HOLD-UP POWER STORAGE DEVICES

STATEMENT OF GOVERNMENT INTEREST

This invention was made, at least in part, with U.S. Government support under contract number N00019-06-C-0081, awarded by the U.S. Navy. The U.S. Government may have certain rights in this invention.

BACKGROUND

The present invention is related to hold-up circuits, and in particular to a system and method of recording performance and detecting failures in hold-up circuits.

Hold-up circuitry is employed in a variety of applications to keep a unit or device functional for a limited period of time following the interruption of input power. Hold-up circuitry includes a power storage device, such as a capacitor, that stores power during normal operation and supplies the stored power to the unit or device following interruption of input power. The limited amount of power provided by the power storage device allows the unit or device to perform any necessary functions before shutting down completely.

Failures in the power storage device are traditionally difficult to detect. Oftentimes, a failure of the power storage device is only detected when the device fails to supply power for the time required during a failure of the input power, thus resulting in a latent failure of the system.

SUMMARY

A fault detection circuit is utilized to automatically detect faults in hold-up power storage devices. The fault detection circuit includes a hold-up monitoring circuit connected to monitor output of the hold-up power storage device, wherein the hold-up monitoring circuit measures a duration of time that the hold-up power storage device provides sufficient power following a loss of normal power and detects faults based on the measured duration of time.

DETAILED DESCRIPTION

The present invention provides a system and method for automatically detecting faults associated with hold-up power storage circuits or devices. In particular, faults are detected by measuring the amount of time that the hold-up power storage device provides sufficient power following a loss of normal power.

Figure 1:
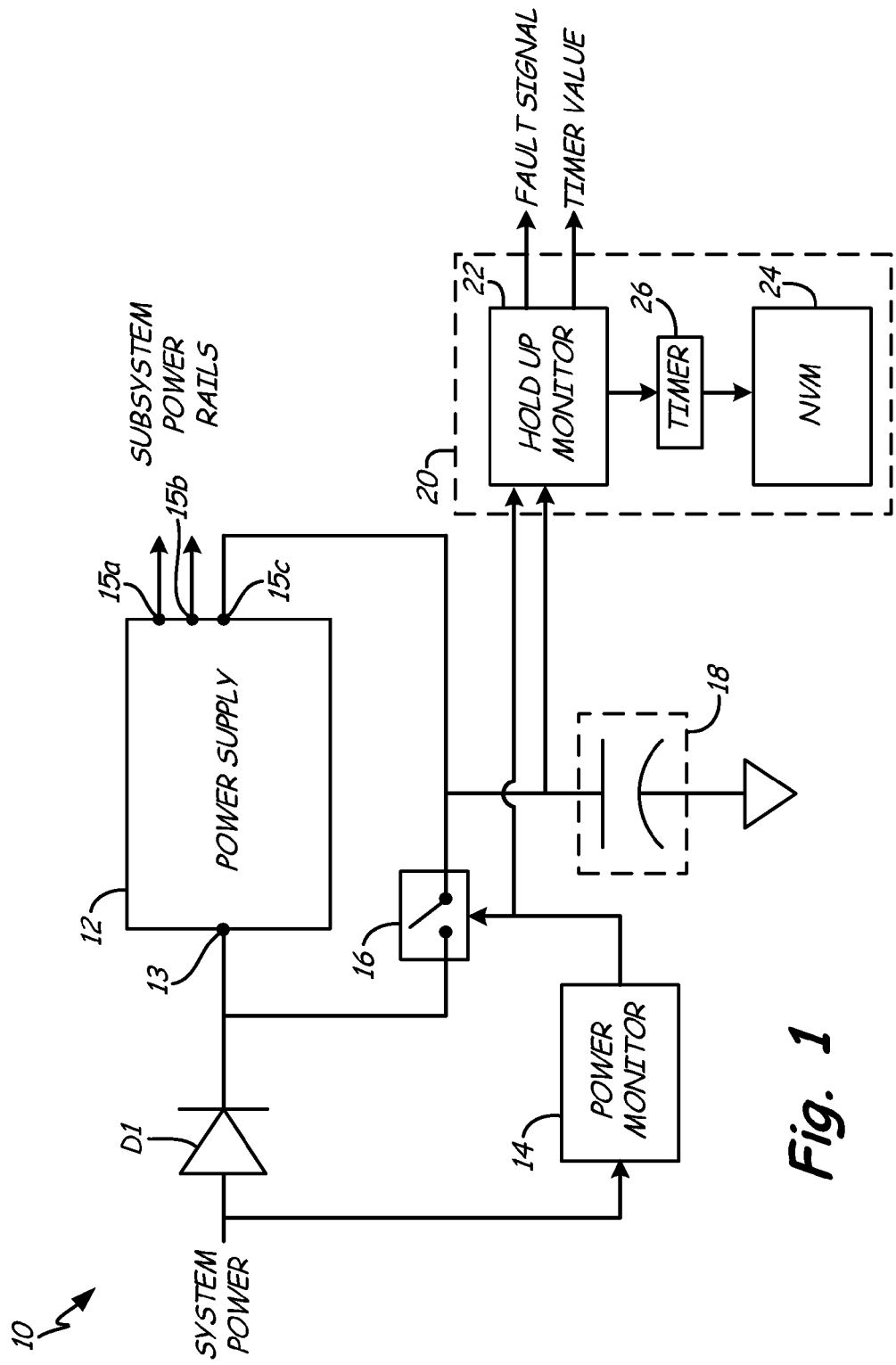
FIG. 1 is a circuit diagram of a power supply system that includes hold-up circuitry and monitoring circuitry according to embodiments of the present invention.

FIG. 1 is a circuit diagram of power supply system 10, which includes hold-up circuitry and monitoring circuitry according to embodiments of the present invention. Power supply system 10 shown in FIG. 1 includes power supply circuit 12, power monitor circuit 14, switch circuit 16, hold-up power storage device 18, diode D1, and hold-up fault detection circuit 20, which includes monitoring circuit 22, memory 24 and timer 26.

System power is provided via diode D1 to input 13 of power supply 12. Power supply 12 converts/distributes the power supplied by system power to one or more outputs or loads (not shown) via output terminals 15a, 15b, and 15c. At least one of the outputs (e.g., output 15c) of power supply 12 is provided to charge hold-up power storage device 18. During normal operation, when system power is On, hold-up power storage device 18 is fully charged, and remains fully charged until system power turns Off.

Power monitor 14 monitors the system power to detect a loss of system power. Loss of power refers both to catastrophic losses of power due to a failure, and regular loss of power associated with normal shutdown of a system. Monitoring of the system power may include monitoring the voltage, current, or a combination thereof supplied by system power to power supply 12. Upon detecting a loss of system power, power monitor 14 closes switch circuit 16 to connect hold-up power storage device 18 to input 13 of power supply 12, thereby maintaining power to power supply 12 and those loads connected to power supply 12 for a limited amount of time. The power supplied by hold-up power storage device allows power supply 12 and systems receiving power from power supply 12 to remain functional for a specified minimum amount of time and then shut-down in an orderly fashion. Included in systems receiving power from power supply 12 is fault detection circuit 20, which must remain powered during loss of system power.

Fault detection circuit 20 measures the storage capacity of power storage device 18. The measurement by fault detection circuit 20 is performed during the power down cycle (e.g., when system power is lost either through a fault or shut-down) and is based on the duration of time that hold-up power storage device 18 provides the desired amount of power. In general, hold-up monitoring circuit 22 monitors the state of system power, and in response to a loss of system power starts timer 26. Hold-up monitoring circuit 22 monitors the power supplied by hold-up power storage device 18, and when the monitored power falls below a threshold value, hold-up monitoring circuit 22 stops timer 26. The value stored by timer 26 is an indication of the storage capacity of power storage device 18. The measured timer value is stored in memory 24.

In the embodiment shown in FIG. 1, the output provided by hold-up power monitor circuit 14 to switching circuit 16 is also provided to hold-up monitoring circuit 22. In this way, monitoring circuit is not responsible and does not need to include circuitry for directly monitoring system power, but rather relies on the monitoring provided by power monitor circuit 14. When power monitor circuit 14 detects a loss of system power, this is communicated to both switching circuit 16 and hold-up monitoring circuit 22. In response, hold-up monitoring circuit 22 begins the timer used to measure the storage capacity of hold-up power storage device 18. In other embodiments, hold-up monitoring circuit 22 directly monitors the system power to detect a loss of system power. In this embodiment, hold-up monitoring circuit 22 may utilize the same threshold utilized by power monitor circuit 14 to detect loss of system power, such that both circuits trigger at the same threshold level.

In response to a detected loss of system power, hold-up monitoring circuit 22 starts timer 26, which may be implemented in software, hardware, or a combination thereof. Hold-up monitoring circuit 22 monitors power supplied by hold-up power storage device 18, which may include monitoring voltage, current, or a combination thereof, and compares the monitored power to a threshold value. In one embodiment, the threshold value is selected so as to provide sufficient time for monitoring circuit to stop timer 26 and store the value associated with timer 26 to memory 24 before all power is lost. Upon reaching the threshold value, hold-up monitoring circuit 22 stops timer 26 and causes the value of timer 26 to be stored to memory 24. The stored timer value is representative of the storage capacity of power storage device 18. In one embodiment, memory 24 only stores a single timer value, which is rewritten with each new power down cycle. In other embodiments, memory 24 is capable of storing a plurality of timer values, collected over successive power down cycles. Storing a plurality of timer values allows fault detection circuit 20 to monitor changes in storage capacity over time and make determinations regarding the health of power storage unit 18 based on historical data.

Hold-up monitoring circuit 22 generates a fault signal indicating a fault in power storage device 18. In one embodiment, hold-up monitoring circuit 22 compares the timer value provided by timer 26 and stored to memory 24 to a threshold timer value (also stored in memory 24) to determine whether storage capacity has diminished beyond an acceptable level. If the timer value is less than the threshold timer value, then hold-up monitoring circuit 22 generates a fault signal. The fault signal may be communicated to a higher level controller or system for reporting to a user or maintenance system. In addition, hold-up monitoring circuit 20 may communicate timer values stored to memory 24, either all timer values or only those indicative of a fault condition for subsequent review or processing by the higher level controller or system. In another embodiment, hold-up monitoring circuit 22 only provides timer values as an output, and leaves higher level controllers (not shown) to process the values and determine whether storage capacity has degraded.

Figure 2:
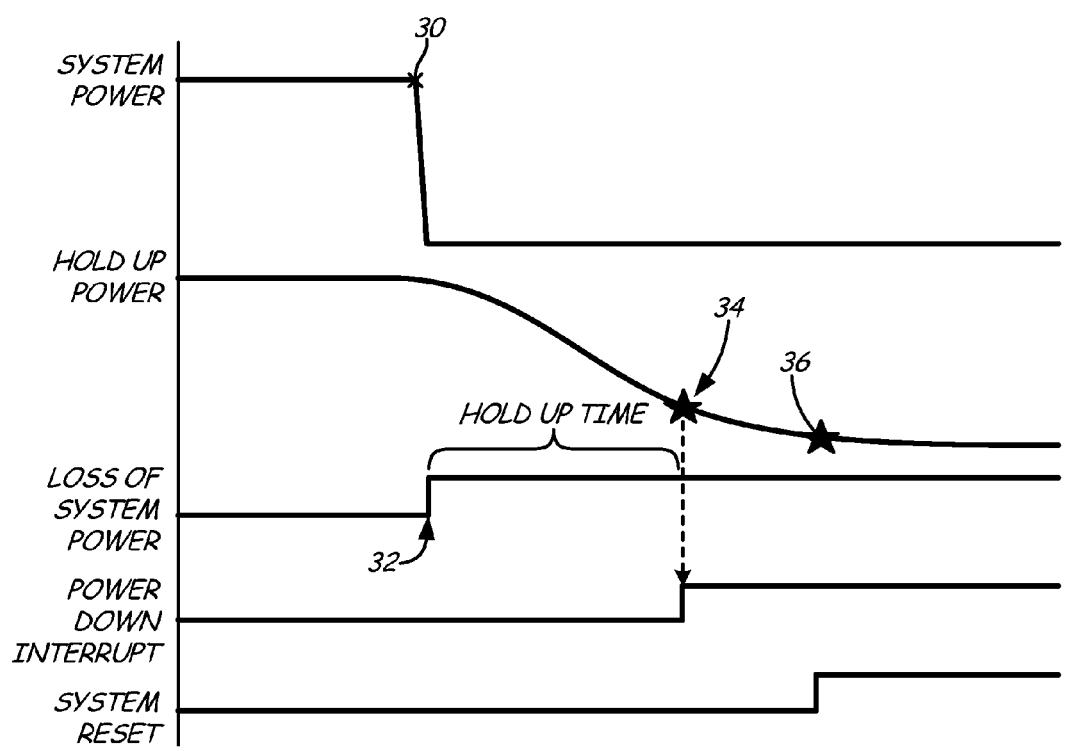
FIG. 2 is a timing diagram illustrating monitoring of hold-up circuitry during shut-down according to an embodiment of the present invention.

FIG. 2 is a timing diagram illustrating monitoring of hold-up circuitry during shut-down according to an embodiment of the present invention. The timing diagram illustrates system power, hold-up power, detected loss of system power, power down interrupt, and system reset. At time 30, system power is lost as indicated by the sudden decrease in the monitored system power. At time 32, loss of system power is detected, either by power monitoring circuit 14, hold-up monitoring circuit 22, or both. The detected loss of system power triggers the start of timer 26 in hold-up monitoring circuit 22. In addition, the loss of system power detected by power monitor circuit 14 triggers closing switch circuit 16 to begin supplying power to power supply 12 from power storage device 18. As a result, the measure of hold-up power begins decreasing as power storage device 18 begins discharging power.

At time 34, the measure of hold-up power reaches a threshold value indicating that only a limited amount of power remains, which triggers stopping of the timer. This threshold may vary based on the application, but typically represents the point at which only enough power remains to shut-down systems gracefully. The difference between time 32 and time 34 represents the hold-up time, and is a measure of the storage capacity associated with power storage device 18. At time 36, nearly all power has been depleted from power storage device 18, and the system resets as indicated by system reset waveform.

Figure 3:
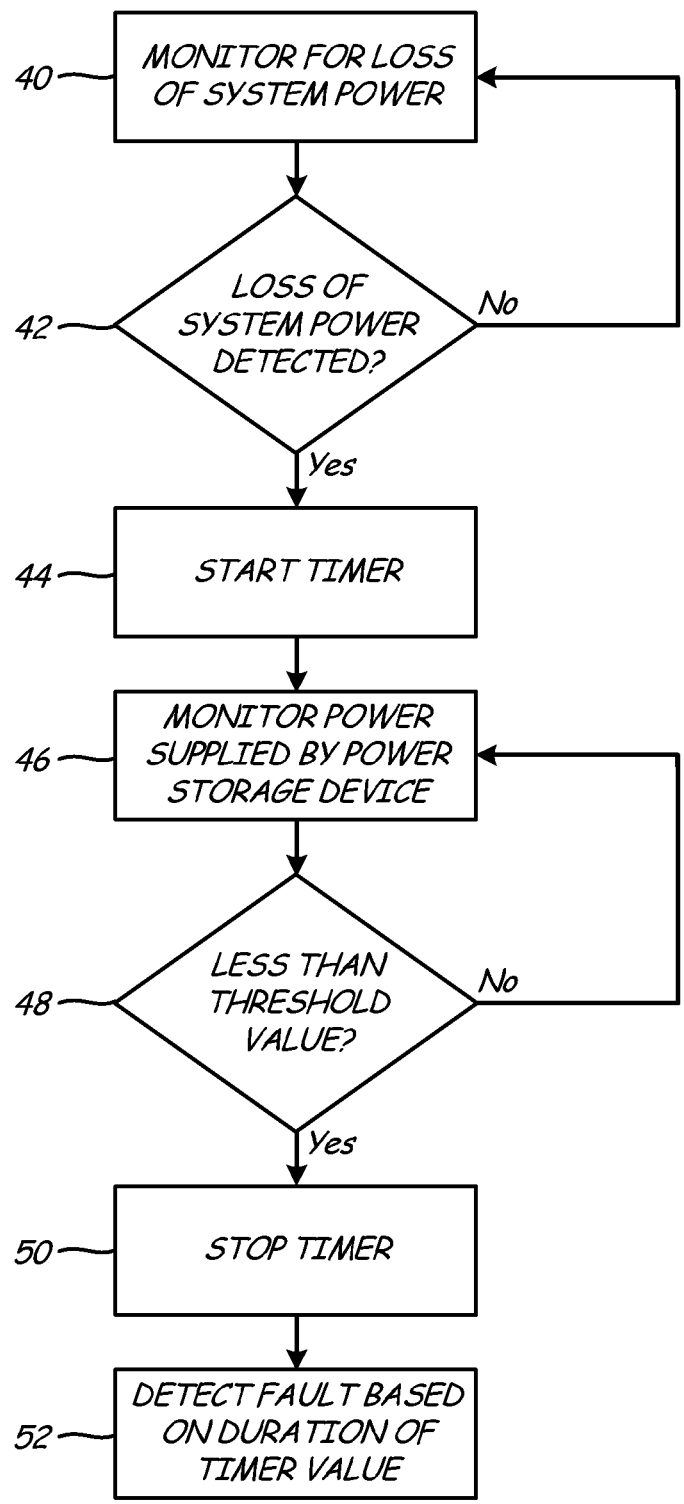
FIG. 3 is a flowchart illustrating operations performed by monitoring circuitry according to an embodiment of the present invention.

FIG. 3 is a flowchart illustrating operations performed by fault detection circuit 20 according to an embodiment of the present invention. As discussed with respect to FIG. 1, one or more of these steps may be performed by individual components within fault detection circuit 20, such as hold-up monitoring circuit 22.

In the embodiment shown in FIG. 3, the process starts at step 40 with monitoring for loss of system power. At step 42, fault detection circuit 20 monitors whether a loss of system power has been detected. Fault detection circuit 20 may monitor system power directly, or may monitor for a signal provided by another circuit (such as power monitor circuit 14) indicating that loss of system power has been detected. If no loss of system power has been detected, then monitoring continues at step 40. If loss of system power has been detected at step 42, then fault detection circuit 20 starts the timer at step 44.

At step 46, fault detection circuit 20 monitors the power supplied by power storage device 18. This may include monitoring the voltage, current, or a combination thereof. At step 48, fault detection circuit determines whether the monitored power provided by the power storage device is less than a threshold value, indicating near-total discharge of power storage device 18. If the monitored power is not less than a threshold value, then monitoring continues at step 46. If the monitored power is less than a threshold value, then at step 50 fault detection circuit 20 stops timer 26, thereby setting the duration of the hold-up time. At step 52, the timer value is stored to memory 24 just prior to all power being lost. In other embodiments, storing the timer value may also include communicating the timer value to a higher level controller or comparing the timer value to a threshold value to determine whether or not to generate a fault condition. In some embodiments, the fault condition is generated prior to total shutdown of the system, and in other embodiments, the fault condition is not generated until the next power-up cycle, at which time fault detection circuit 20 retrieves the stored timer value from memory 24, compares it to a threshold value, and generates a corresponding fault condition if required.

The following are non-exclusive descriptions of possible embodiments of the present invention.

A fault detection circuit for a hold-up power storage device according to an exemplary embodiment of this disclosure, among other possible things includes: a hold-up monitoring circuit connected to monitor output of the hold-up power storage device, wherein the hold-up monitoring circuit measures a duration of time that the hold-up power storage device provides sufficient power following a loss of normal power and detects faults based on the measured duration of time.

The fault detection circuit of the preceding paragraph can optionally include, additionally and/or alternatively, any one or more of the following features, configurations and/or additional components.

A memory device may be connected to store the measured duration of time that the hold up power storage device provides sufficient power following a loss of normal power.

The memory device may store a plurality of timer values provided in response to successive losses of system power.

A timer may measure the duration of time that the hold-up power storage device provides sufficient power following a loss of normal power, wherein the hold-up monitoring circuit starts the timer in response to a detected loss of normal power and stops the timer when the monitored output of the hold-up power storage device falls below a threshold value.

The threshold value used to stop the timer may be selected to allow the hold-up monitoring circuit sufficient time to store the timer value before the hold-up power storage device is completely depleted.

The fault detection circuit may generate a fault detected signal if the timer value is less than a timer threshold value.

The fault detection circuit may provide an output that includes the timer value and a fault detected signal.

The hold-up monitoring circuit may monitor the system power and compare the monitored system power to a threshold to detect a loss of system power.

The hold-up monitoring circuit may receive an input from an external circuit indicating a detected loss of system power.

A method of detecting faults in a hold-up power storage device according to an exemplary embodiment of this disclosure, among other possible things includes: detecting a loss of system power, starting a timer in response to the detected loss of system power, monitoring power supplied by the hold-up power storage device, stopping the timer in response to the monitored power supplied by the hold-up power storage device decreasing below a threshold value, and detecting a fault in the hold-up power storage device based on a duration of the timer value.

A further embodiment of the foregoing method may include monitoring the system power and comparing the monitored system power to a threshold value to detect a loss of system power.

A further embodiment of the foregoing method may include comparing the duration of the timer value to a timer threshold value, wherein if the duration of the timer value is less than the timer threshold value then a fault is detected.

A further embodiment of the foregoing method may include storing the timer duration value to memory.

A power supply system according to an exemplary embodiment of this disclosure, among other possible things includes a power supply circuit connected to receive system power at an input and to provide power at one or more outputs, a hold-up power storage device that receives charging power from an output of the power supply circuit during normal operation and provides power to the input of the power supply circuit in response to a loss of system power input, a power monitor circuit that monitors the system power and selectively connects the hold-up power storage device to the input of the power supply circuit in response to a detected loss of system power, and a fault detection circuit that monitors a duration of time the hold-up power storage device supplies power following a detected loss of system power, wherein a fault condition associated with the hold-up power storage device is detected if the monitored duration of time is less than a threshold value.

The power supply system of the preceding paragraph can optionally include, additionally and/or alternatively, any one or more of the following features, configurations and/or additional components.

A further embodiment of the foregoing power supply system may include a timer for measuring the duration of time the hold-up power storage device supplies power.

A further embodiment of the foregoing power supply system may start the timer in response to a detected loss of system power and stops the timer in response to power supplied by the hold-up power storage device falling below a threshold value.

A further embodiment of the foregoing power supply system may provide outputs that include the measured timer value and an indication of a detected fault condition.

A further embodiment of the foregoing power supply system may include a memory for storing one or more timer values measured by the fault detection circuit.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A fault detection circuit for detecting faults in a hold-up power storage device, the fault detection circuit comprising:
   a hold-up monitoring circuit connected to monitor output of the hold-up power storage device, wherein the hold-up monitoring circuit includes a timer for measuring a duration of time that the hold-up power storage device provides sufficient power following a loss of normal power and detects faults based on the measured duration of time, wherein the hold-up monitoring circuit starts the timer in response to a detected loss of normal power and stops the timer when the monitored output of the hold-up power storage device falls below a threshold value; and
   a memory device connected to store the measured duration of time that the hold-up power storage device provides sufficient power following a loss of normal power.

2. The fault detection circuit of claim 1, wherein the memory device stores a plurality of timer values provided in response to successive losses of system power.

3. The fault detection circuit of claim 1, wherein the threshold value used to stop the timer is selected to allow the hold-up monitoring circuit sufficient time to store the timer value before the hold-up power storage device is completely depleted.

4. The fault detection circuit of claim 1, wherein the fault detection circuit generates a fault detected signal if the timer value is less than a timer threshold value.

5. The fault detection circuit of claim 4, wherein the hold-up monitoring circuit generates outputs that include the timer value and the fault detected signal.

6. The fault detection circuit of claim 1, wherein the hold-up monitoring circuit monitors the system power and compares the monitored system power to a threshold to detect a loss of system power.

7. The fault detection circuit of claim 1, wherein the hold-up monitoring circuit receives an input from an external circuit indicating a detected loss of system power.

8. A method of detecting faults in a hold-up power storage device, the method comprising:
   detecting a loss of system power;
   starting a timer in response to the detected loss of system power;
   monitoring power supplied by the hold-up power storage device;
   stopping the timer in response to the monitored power supplied by the hold-up power storage device decreasing below a threshold value; and
   detecting a fault in the hold-up power storage device based on a duration of the timer value.

9. The method of claim 8, wherein detecting a loss of system power includes monitoring the system power and comparing the monitored system power to a threshold value to detect a loss of system power.

10. The method of claim 8, wherein detecting a fault in the hold-up power storage device includes comparing the duration of the timer value to a timer threshold value, wherein if the duration of the timer value is less than the timer threshold value then a fault is detected.

11. The method of claim 8, further includes storing the timer duration value to memory.

12. A power supply system comprising:
   a power supply circuit connected to receive system power at an input and to provide power at one or more outputs;

a hold-up power storage device that receives charging power from an output of the power supply circuit during normal operation and provides power to the input of the power supply circuit in response to a loss of system power input;

a power monitor circuit that monitors the system power and selectively connects the hold-up power storage device to the input of the power supply circuit in response to a detected loss of system power; and a fault detection circuit that monitors a duration of time the hold-up power storage device supplies power following a detected loss of system power, wherein a fault condition associated with the hold-up power storage device is detected if the monitored duration of time is less than a threshold value.

13. The power supply system of claim 12, wherein the fault detection circuit includes a timer for measuring the duration of time the hold-up power storage device supplies power.

14. The power supply system of claim 12, wherein the fault detection circuit includes a hold-up monitoring circuit that receives an input from the power monitor circuit indicating a loss of system power.

15. The power supply system of claim 14, wherein the hold-up monitoring circuit circuit starts the timer in response to a detected loss of system power and stops the timer in response to power supplied by the hold-up power storage device falling below a threshold value.

16. The power supply system of claim 14, wherein the hold-up monitoring circuit provides outputs that include the measured timer value and an indication of a detected fault condition.

17. The power supply system of claim 14, further including:

a memory for storing one or more timer values measured by the fault detection circuit.

\* \* \* \* \*